United States Patent
Park

(10) Patent No.: US 9,847,060 B2
(45) Date of Patent: *Dec. 19, 2017

(54) DC-DC CONVERTER AND ORGANIC LIGHT EMITTING DISPLAY INCLUDING THE SAME

(71) Applicant: Samsung Display Co., Ltd., Yongin-si, Gyeonggi-do (KR)

(72) Inventor: Sung-Cheon Park, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/147,102

(22) Filed: May 5, 2016

(65) Prior Publication Data
US 2016/0247454 A1     Aug. 25, 2016

Related U.S. Application Data

(63) Continuation of application No. 13/536,225, filed on Jun. 28, 2012, now Pat. No. 9,337,718.

(30) Foreign Application Priority Data

Mar. 6, 2012   (KR) .................. 10-2012-0022840

(51) Int. Cl.
 *G05F 1/00*   (2006.01)
 *G09G 3/3258*  (2016.01)
 (Continued)

(52) U.S. Cl.
 CPC ......... *G09G 3/3258* (2013.01); *G09G 3/3225* (2013.01); *G09G 3/3266* (2013.01);
 (Continued)

(58) Field of Classification Search
 CPC ..... H02M 3/158; H02M 3/1582; G06F 3/042; G06F 3/041; G09G 3/3208
 (Continued)

(56) References Cited

U.S. PATENT DOCUMENTS 5,479,329 A    12/1995  Motonobu et al.
7,986,108 B2   7/2011   Yinn et al.
(Continued)

FOREIGN PATENT DOCUMENTS

CN    102196619    9/2011
EP     1951005    7/2008
(Continued)

OTHER PUBLICATIONS

Search Report dated Jun. 13, 2013 in European Patent Application No. 12186650.3, claiming priority to Korean priority application No. 10-2012-0022840.

*Primary Examiner* — Yuzhen Shen
(74) *Attorney, Agent, or Firm* — Knobbe Martens Olson & Bear, LLP

(57) ABSTRACT

Disclosed are a direct current converter and an organic light emitting display including the converter. The converter includes a power generator configured to generate a first voltage; an output terminal connected to the power generator and configured to output the first voltage; a feedback terminal connected to an external feedback wiring and configured to input a second voltage to a selector; and the selector connected to the first power generator, and configured to transfer the first voltage or the second voltage to the first power generator.

19 Claims, 4 Drawing Sheets

(51) Int. Cl.
*H02M 1/32* (2007.01)
*H02M 3/156* (2006.01)
*H05B 33/08* (2006.01)
*G09G 3/3225* (2016.01)
*G09G 3/3266* (2016.01)
*G09G 3/3291* (2016.01)
*H02M 1/08* (2006.01)
*H02M 3/158* (2006.01)
*G06F 3/042* (2006.01)
*H02M 1/00* (2006.01)

(52) U.S. Cl.
CPC ............ *G09G 3/3291* (2013.01); *H02M 1/08* (2013.01); *H02M 1/32* (2013.01); *H02M 3/156* (2013.01); *H02M 3/158* (2013.01); *H05B 33/0815* (2013.01); *H05B 33/0887* (2013.01); *H05B 33/0896* (2013.01); *G06F 3/042* (2013.01); *G09G 2300/0819* (2013.01); *G09G 2300/0823* (2013.01); *G09G 2310/0256* (2013.01); *G09G 2310/0278* (2013.01); *G09G 2330/00* (2013.01); *G09G 2330/04* (2013.01); *H02M 2001/0025* (2013.01); *H02M 2001/325* (2013.01)

(58) Field of Classification Search
USPC .............................. 345/212, 76, 82; 315/291
See application file for complete search history.

(56) References Cited

U.S. PATENT DOCUMENTS

| | | | |
|---|---|---|---|
| 8,169,163 | B2 | 5/2012 | Kang et al. |
| 8,334,824 | B2* | 12/2012 | Park .................. H02M 3/158 341/50 |
| 8,446,098 | B2 | 5/2013 | Shiu et al. |
| 9,337,718 | B2* | 5/2016 | Park .................. H05B 33/0815 |
| 2004/0212420 | A1* | 10/2004 | Otake .................. H02M 3/156 327/536 |
| 2004/0217653 | A1* | 11/2004 | Neidorff .................. H02J 9/06 307/80 |
| 2007/0257645 | A1 | 11/2007 | Nishino |
| 2008/0174287 | A1 | 7/2008 | Park |
| 2008/0246702 | A1 | 10/2008 | Lee et al. |
| 2009/0219275 | A1 | 9/2009 | Jeon |
| 2010/0073835 | A1 | 3/2010 | Jung |
| 2010/0127678 | A1 | 5/2010 | Inatomi et al. |
| 2011/0089859 | A1 | 4/2011 | Tseng et al. |
| 2011/0254469 | A1 | 10/2011 | Ruan et al. |
| 2011/0260644 | A1 | 10/2011 | Lee et al. |
| 2013/0187570 | A1 | 7/2013 | Oshima et al. |

FOREIGN PATENT DOCUMENTS

| | | |
|---|---|---|
| KR | 10-0796155 | 1/2008 |
| KR | 10-0833764 | 5/2008 |
| KR | 10-2009-0093019 | 2/2009 |

\* cited by examiner

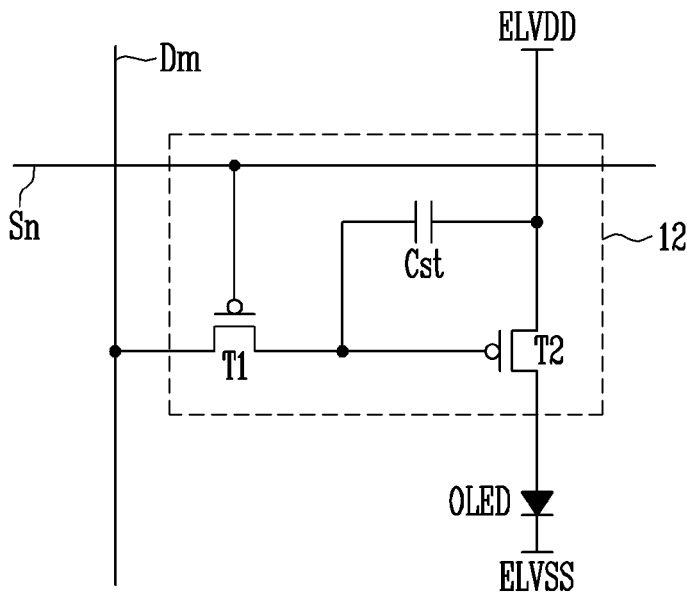

DC-DC CONVERTER AND ORGANIC LIGHT EMITTING DISPLAY INCLUDING THE SAME

CROSS-REFERENCE TO RELATED APPLICATIONS

This application is a continuation of U.S. patent application Ser. No. 13/536,225, filed on Jun. 28, 2012, which claims priority to, and the benefit of, Korean Patent Application No. 10-2012-0022840, filed on Mar. 6, 2012, in the Korean Intellectual Property Office, the entire contents of which are incorporated herein by reference.

BACKGROUND

Field

The present disclosure relates to a direct current (DC)-DC converter and an organic light emitting display including the same, in which the DC-DC converter is capable of being normally operated without additional damage if a feedback wiring present at an outer portion thereof is disconnected.

Description of the Related Technology

Recently, various displays capable of reducing weight and volume, which are disadvantages of a cathode ray tube, have been developed. As examples of these displays, there are liquid crystal display (LCD), a field emission display (FED), a plasma display panel (PDP), an organic light emitting display (OLED), and the like.

Among them, the organic light emitting display, which displays an image using an organic light emitting diode generating light by recombination between electrons and holes, has advantages including a rapid response speed and being driven at low power.

The OLED is configured to include a display module including a scan driver, a data driver, and a pixel unit to display a screen; and a direct current (DC)-DC converter supplying power to the display module.

The DC-DC converter generates power required for driving the pixel unit by converting external power. The DC-DC converter may receive output voltage fed back through a feedback wiring present at an outer portion of the DC-DC converter in order to appropriately adjust output power voltage.

That is, the DC-DC converter may be operated in a scheme of increasing the output power voltage when the fed back voltage is low, and decreasing the output power voltage when the fed back voltage is high.

However, if the feedback wiring is disconnected due to impact or the like, the fed back voltage rapidly decreases, and the DC-DC converter continuously increases the output power voltage correspondingly.

Therefore, power voltage exceeding an allowable range is supplied to circuits configuring the display module, thereby potentially causing to damage the circuits.

SUMMARY OF CERTAIN INVENTIVE ASPECTS

An object of the present invention is to provide a direct current (DC)-DC converter which can be normally operated without an additional damage if a feedback wiring present at an outer portion thereof is disconnected. Embodiments disclosed herein also include an organic light emitting display including the DC-DC converter.

According to one embodiment, there is provided a direct current DC-DC converter, including: a power supply generating an input power, a first power generator receiving the input power and a selected voltage from a selector and generating a first voltage, a first output terminal connected to the first power generator and outputting the first voltage; a second power generator receiving the input power and generating a second voltage, a second output terminal connected to the second power generator and outputting the second voltage, an external feedback wiring providing a feedback voltage, a feedback terminal connected to the external feedback wiring and inputting the feedback voltage to the selector, and the selector connected to and transferring the selected voltage to the first power generator, where the selected voltage is one of the feedback voltage and the voltage output from the first output terminal.

The selector may include: a switching unit including a first and a second switching device transferring the selected voltage to the first power generator, where the first switching device may transfer the voltage output from the first output terminal and the second switching device may transfer the feedback voltage input from the feedback terminal; and a controller controlling the alternate turn-ons of the first switching device and the second switching device.

The controller may include a comparator comparing the feedback voltage with a preset reference voltage to determine which of the first and second switching devices to turn on. The second switching device may be turned on if the feedback voltage is larger than the preset reference voltage, and the first switching device may be turned on if the feedback voltage is smaller than the preset reference voltage.

The first switching device and the second switching device may be implemented as a transistor, and the controller may include: a first inverter having an input terminal connected to the feedback terminal and an output terminal connected to an input terminal of a second inverter and a gate electrode of the second switching device; and the second inverter having an input terminal connected to the output terminal of the first inverter and an output terminal connected to a gate electrode of the first switching device.

The first power generator may include: a first inductor connected between the power supply unit and a first node; a first transistor connected between the first node and a ground power supply; a second transistor connected between the first node and the first output terminal; a first switching controller controlling the first transistor and the second transistor; and a first voltage divider dividing voltage supplied from the selector to supply the divided voltage to the switching controller.

The first voltage divider may include a plurality of resistors connected in series with each other.

The second power generator may include: a third transistor connected between the power supply unit and a second node; a fourth transistor connected the second node and the second output terminal; a second inductor connected between the second node and a ground power supply; a second switching controller controlling the third transistor and the fourth transistor; and a second voltage divider dividing voltage at the output terminal to supply the divided voltage to the second switching controller.

The second voltage divider may include a plurality of resistors connected in series with each other.

The first voltage may have a positive polarity, and the second voltage may have a negative polarity.

According to another embodiment, there is provided an organic light emitting display including: a plurality of pixels connected to scan lines, data lines, a first power line and a second power line; and a DC-DC converter generating a first voltage and a second voltage to respectively supply to the pixels through the first power line and the second power line, wherein the DC-DC converter includes: a power supply generating an input power, a first power generator receiving the input power and a selected voltage from a selector and generating a first voltage, a first output terminal connected to the first power generator and outputting the first voltage; a second power generator receiving the input power and generating a second voltage, a second output terminal connected to the second power generator and outputting the second voltage, an external feedback wiring providing a feedback voltage, a feedback terminal connected to the external feedback wiring and inputting the feedback voltage to the selector, and the selector connected to and transferring the selected voltage to the first power generator, where the selected voltage is one of the feedback voltage and the voltage output from the first output terminal.

The selector may include: a first and a second switching device transferring the selected voltage to the first power generator, where the first switching device may transfer the voltage output from the first output terminal and the second switching device may transfer the feedback voltage input from the feedback terminal; and a controller controlling the alternate turn-ons of the first switching device and the second switching device.

The controller may include a comparator comparing the feedback voltage with a preset reference voltage to determine which of the first and second switching devices to turn on. The second switching device may be turned on if the feedback voltage is larger than the preset reference voltage, and the first switching device may be turned on if the feedback voltage is smaller than the preset reference voltage.

The first switching device and the second switching device may be implemented as a transistor, and the controller may include: a first inverter having an input terminal connected to the feedback terminal and an output terminal connected to an input terminal of a second inverter and a gate electrode of the second switching device; and the second inverter having an input terminal connected to the output terminal of the first inverter and an output terminal connected to a gate electrode of the first switching device.

The first power generator may include: a first inductor connected between the power supply unit and a first node; a first transistor connected between the first node and a ground power supply; a second transistor connected between the first node and the first output terminal; a first switching controller controlling the first transistor and the second transistor; and a first voltage divider dividing voltage supplied from the selector to supply the divided voltage to the switching controller.

The first voltage divider may include a plurality of resistors connected in series with each other.

The second power generator may include: a third transistor connected between the power supply unit and a second node; a fourth transistor connected the second node and the second output terminal; a second inductor connected between the second node and a ground power supply; a second switching controller controlling the third transistor and the fourth transistor; and a second voltage divider dividing voltage at the output terminal to supply the divided voltage to the second switching controller.

The second voltage divider may include a plurality of resistors connected in series with each other.

The first voltage may have a positive polarity, and the second voltage may have a negative polarity.

The organic light emitting display according to the present invention may further include a scan driver supplying scan signals to pixels through the scan lines; and a data driver supplying data signals to pixels through the data line.

BRIEF DESCRIPTION OF THE DRAWINGS

The accompanying drawings, together with the specification, illustrate certain embodiments of the present invention, and, together with the description, serve to explain the principles of the present invention.

FIG. 2 is a view showing a pixel shown in FIG. 1;

FIG. 3 is a view showing an embodiment of a direct current DC-DC converter;

DETAILED DESCRIPTION OF CERTAIN INVENTIVE EMBODIMENTS

Figure 1:
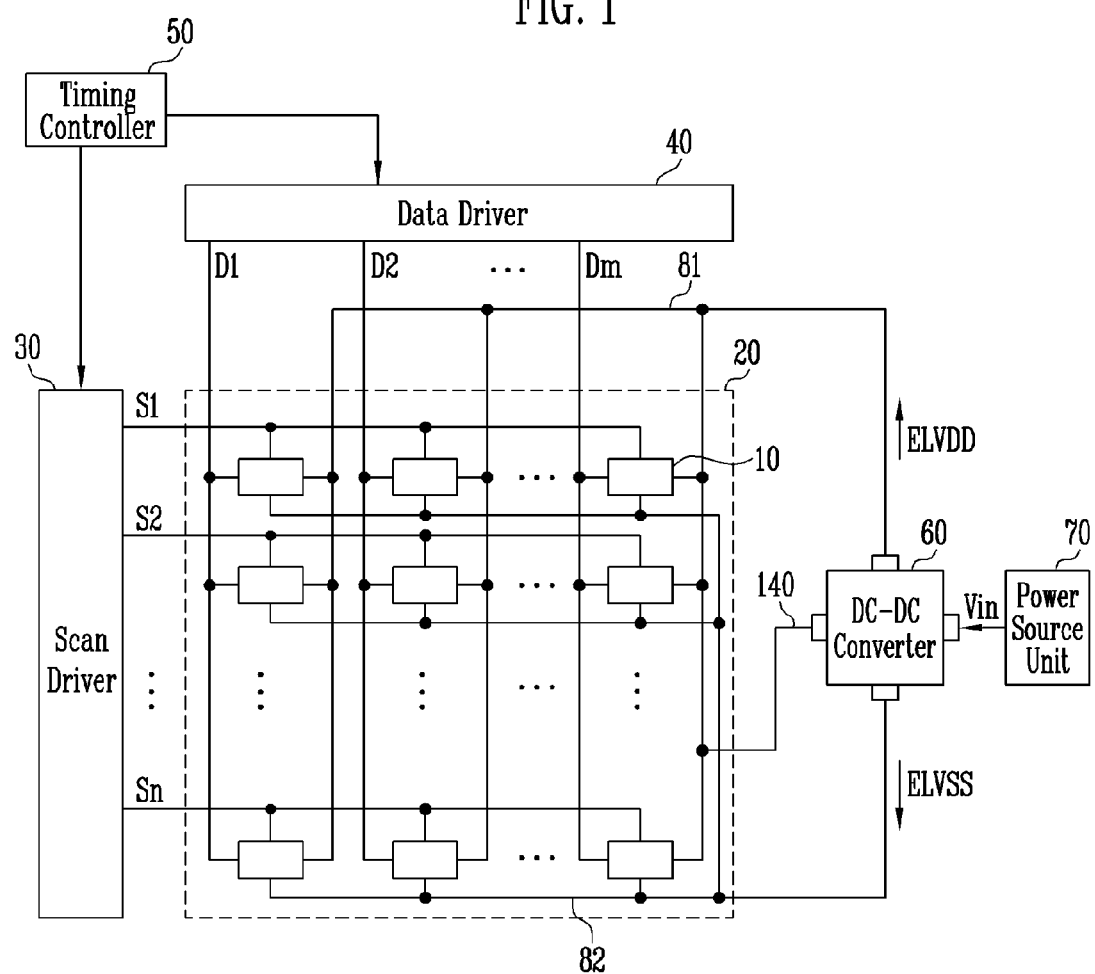
FIG. 1 is a view showing an embodiment of an organic light emitting display.

In the following detailed description, only certain embodiments of the present invention have been shown and described, simply by way of illustration. As those skilled in the art would realize, the described embodiments may be modified in various ways, without departing from the spirit or scope of the present invention. Accordingly, the drawings and description are to be regarded as illustrative in nature and not restrictive. In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the other element with one or more intervening elements interposed therebetween. Hereinafter, like reference numerals generally refer to like elements.

Advantages and features of the present invention and methods to achieve them will be elucidated from certain embodiments described below in detail with reference to the accompanying drawings. However, the present invention is not limited to embodiments disclosed below, but may be implemented in various different forms.

FIG. 1 is a view showing an embodiment of an organic light emitting display.

Referring to FIG. 1, an embodiment of the organic light emitting display may include: a pixel unit 20 including pixels 10 each connected to scan lines S1 through Sn, data lines D1 through Dm, a first power line 81, and a second power line 82; a scan driver 30 supplying scan signals to each pixel 10 through the scan lines S1 through Sn; a data driver 40 supplying data signals to each pixel 10 through the data lines D1 through Dm; and a DC-DC converter 60 supplying first power ELVDD and second power ELVSS to each pixel 10 through the first power line 81 and the second power line 82. In addition, the organic light emitting display may further include a timing controller 50 for controlling the scan driver 30 and the data driver 40. Each of the pixels 10 receiving the first power ELVDD and the second power ELVSS from the DC-DC converter 60 through the first power line 81 and the second power line 82 generates light corresponding to the data signal by current flowing from a first power supply ELVDD to a second power supply ELVSS via the organic light emitting diode.

The scan driver 30 generates the scan signals by a control of the timing controller 50 and supplies the generated scan signals to the scan lines S1 through Sn.

The data driver 40 generates the data signals by a control of the timing controller 50 and supplies the generated data signals to the data lines D1 through Dm.

When the scan signals are sequentially supplied to the scan lines S1 through Sn, the pixels 10 are sequentially selected for each line and the selected pixels 10 receive the data signals transferred from the data lines D1 through Dm.

FIG. 2 is a view showing a pixel shown in FIG. 1. Particularly, for convenience of explanation, a pixel connected to an n-th scan line Sn and an m-th data line Dm is shown in FIG. 2.

Referring to FIG. 2, each pixel 10 may include an organic light emitting diode (OLED) and a pixel circuit 12 connected to the data line Dm and the scan line Sn to control the OLED.

An anode electrode of the OLED is connected to the pixel circuit 12, and a cathode electrode thereof is connected to the second power supply ELVSS.

The OLED generates light having a predetermined brightness corresponding to current supplied from the pixel circuit 12.

The pixel circuit 12 may control an amount of current supplied to the OLED, corresponding to the data signal supplied to the data line Dm when the scan signal is supplied to the scan line Sn. To this end, the pixel circuit 12 includes a second transistor T2 connected between the first power supply ELVDD and the OLED, a first transistor T1 connected between the second transistor T2, and the data line Dm and the scan line Sn, and a storage capacitor Cst connected between a gate electrode and a first electrode of the second transistor T2.

The gate electrode of the first transistor T1 is connected to the scan line Sn, and the first electrode thereof is connected to the data line Dm. In addition, a second electrode of the first transistor T1 is connected to one side terminal of the storage capacitor Cst. The first electrode is set to one of a source electrode and a drain electrode, and the second electrode is set to the other of the source electrode and the drain electrode. For example, when the first electrode is set to the source electrode, the second electrode is set to the drain electrode.

The first transistor T1 connected to the scan line Sn and the data line Dm is turned-on when the scan signal is supplied from the scan line Sn, thereby supplying the data signal supplied from the data line Dm to the storage capacitor Cst. The storage capacitor Cst is charged with voltage corresponding to the data signal.

The gate electrode of the second transistor T2 is connected to one side terminal of the storage capacitor Cst, and the first electrode thereof is connected to the other side terminal of the storage capacitor Cst and the first power supply ELVDD. In addition, the second electrode of the second transistor T2 is connected to an anode electrode of the OLED.

The second transistor T2 controls an amount of current flowing from the first power supply ELVDD to the second power supply ELVSS via the OLED, corresponding to a voltage value stored in the storage capacitor Cst. The OLED generates light corresponding to the amount of current supplied from the second transistor T2.

The pixel structure in FIG. 2 described above is only an example of the present invention. Therefore the pixel 10 according to the present invention is not limited to having the above-mentioned pixel structure. The pixel circuit 12 has a circuit structure capable of supplying current to the OLED, and may be selected to have any one of currently known various structures.

The DC-DC converter 60 receives input power Vin from a power source unit 70 and converts the input power Vin, to generate the first power ELVDD and the second power ELVSS supplied to each pixel 10.

The first power ELVDD may be set to having a positive polarity, and the second power ELVSS may be set to having a negative polarity.

The power source unit 70 may be a battery providing DC power to an input terminal IN of the DC-DC converter 60 or a rectifying apparatus converting alternating current (AC) power to DC power, but is not limited thereto.

FIG. 3 is a view showing an embodiment of a DC-DC converter.

Referring to FIG. 3, an embodiment of the DC-DC converter 60 includes a first power generator 110, a second power generator 120 and a selector 130.

The first power generator 110 receives the input power Vin supplied from the power source unit 70 to generate the first power ELVDD, and outputs the first power ELVDD to a first output terminal OUT1.

The first power ELVDD output to the first output terminal OUT1 of the first power generator 110 is supplied to each pixel 10 through the first power line 81.

The first power generator 110 may boost the input power Vin using internal devices to generate the first power ELVDD.

In addition, the first power generator 110, which may be a boost type converter boosting the input power Vin, may generate the first power ELVDD with the voltage having the positive polarity.

The second power generator 120 receives the input power Vin supplied from the power source unit 70 to generate the second power ELVSS, and outputs the second power ELVSS to a second output terminal OUT2.

The second power ELVSS output to the second output terminal OUT2 of the second power generator 120 is supplied to each pixel 10 through the second power line 82.

The second power generator 120 bucks the input power Vin using internal devices to generate the second power ELVSS.

In addition, the second power generator 120, which is a buck-type converter bucking the input power Vin, may generate the second power ELVSS with the voltage having the negative polarity.

The selector 130 selectively transfers any one of feedback voltage Vfbp input from the external feedback wiring 140 to a feedback terminal FBP and voltage Vout1 at the first output terminal OUT1 to the first power generator 110.

The first power generator 110 may appropriately adjust a voltage level of the first power supply ELVDD by using the voltage Vfbp fed back by the selector 130 or the voltage Vout1 at the first output terminal OUT1.

The feedback wiring 140 may be electrically connected to the first power line 81 present at the outer portion of the DC-DC converter 60, thereby inputting the voltage of the first power line 81 to the feedback terminal FBP of the DC-DC converter 60. Further, the feedback wiring 140 may be electrically connected to the first power line 81 present in the pixel unit 20.

A voltage drop occurs between the first output terminal OUT1 and the power line 81 connected to the pixels 10, such that a voltage difference is actually present between the voltage Vout1 at the first output terminal OUT1 and the voltage of the first power ELVDD supplied to the pixels 10.

In the case in which the DC-DC converter 60 is connected to the pixels 10 through a flexible printed circuit board (FPCB) at the outer portion of the display module configured of the pixel unit 20, the scan driver 30 and the data driver 40, the above-mentioned voltage difference largely increases.

Therefore, in order to more accurately control the first power generator 110, there is a need to feed back the voltage actually used in the display module, instead of the voltage Vout1 at the first output terminal OUT1.

Accordingly, the feedback wiring 140 electrically connected to the first power line 81 present in the display module is provided and the selector 130 is also provided in the DC-DC converter 60, thereby making it possible to selectively supply any one of the voltage Vout1 at the first output terminal OUT1 and the feedback voltage Vfbp to the first power generator 110.

In the case in which the feedback wiring 140 at the outer portion of the DC-DC converter 60 is disconnected due to impact, or the like, the feedback voltage rapidly decreases, such that the first power generator 110 continuously increases the voltage of the first power ELVDD output to the first output terminal OUT1. Therefore, a circuit, or the like, configuring the OLED may be damaged.

In embodiments disclosed herein, in the case in which the feedback voltage Vfbp decreases due a problem such as disconnection, or the like, of the feedback wiring 140, the selector 130 may supply the voltage Vout1 at the first output OUT1 rather than the feedback voltage Vfbp to the first power generator 110.

Further, as needed, a user, a manufacturer, or the like, that is to use only the voltage Vout1 at the first output terminal OUT1 does not intentionally install the feedback wiring 140 or disconnects an installed feedback wiring 140, thereby making it possible to use only the voltage Vout1 at the first output terminal.

Figure 4:
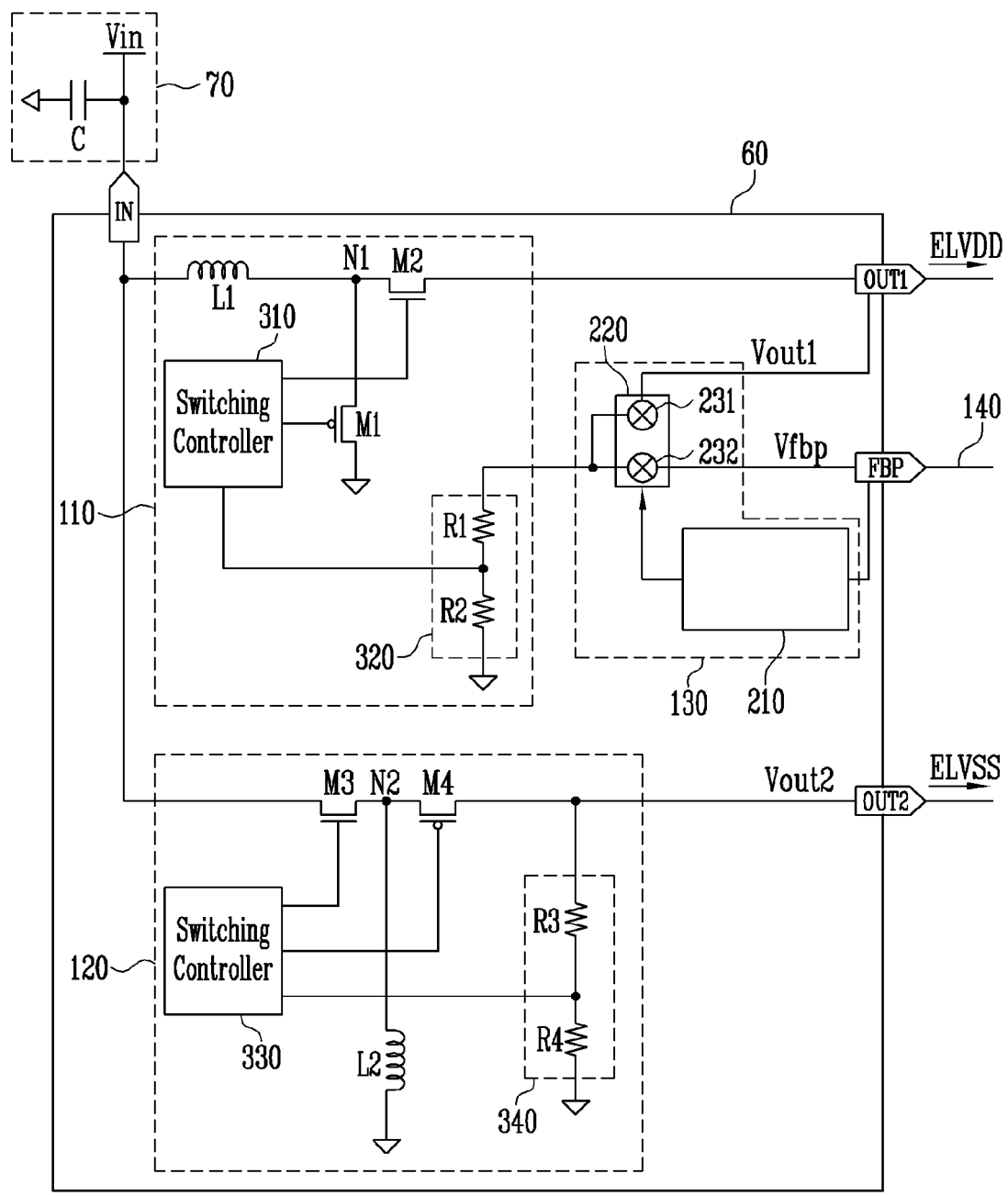
FIG. 4 is a view showing a detailed configuration of the embodiment of a DC-DC converter shown in FIG. 3.

FIG. 4 is a view showing a detailed configuration of the DC-DC converter shown in FIG. 3.

Referring to FIG. 4, an embodiment of the selector 130 may include a controller 210 and a switching unit 220.

The switching unit 220 includes a first switching device 231 and a second switching device 232 to selectively transfer any one of the feedback voltage Vfbp and the voltage Vout1 at the first output terminal OUT1 to the first power generator 110.

The first switching device 231 is connected between the first power generator 110 and the first output terminal OUT1, thereby making it possible to transfer the voltage Vout1 at the first output terminal OUT1 to the first power generator at the time of turn-on thereof.

The second switching device 232 is connected between the first power generator 110 and the feedback terminal FBP, thereby making it possible to transfer the feedback voltage Vfbp input to the feedback terminal FBO to the first power generator 110 at the time of turn-on thereof.

In order to selectively feed back any one of the feedback voltage Vfbp and the voltage at the first output terminal OUT1 to the first power generator 110, the first switching device 231 and the second switching device 232 need to be alternately turned on.

Therefore, the controller 210 controls the first switching device 231 and the second switching device 232 so as to be alternately turned on.

That is, the first output terminal OUT1 may be transferred to the first power generator 110 by turning on the first switching device 231 and turning off the second switching device 232.

In addition, the feedback voltage Vfbp may be transferred to the first power generator 110 by turning off the first switching device 231 and turning on the second switching device 232.

In some embodiments, the first and second switching devices 231 and 232 constituting the switching unit 220 may be implemented as a transistor.

Referring to FIG. 4, the first power generator 110 may include a first inductor L1, a first transistor M1, a second transistor M2, a first switching controller 310 and a first voltage divider 320.

The first inductor L1 is connected between the power source unit 70 and a first node N1.

The first transistor M1 is connected between the first node N1 and a ground power supply.

The second transistor M2 is connected between the first node N1 and the first output terminal OUT1.

The first switching controller 310 controls the first transistor M1 and the second transistor M2. In addition, the first switching controller 310 controls turn-on/off operations of the first transistor M1 and the second transistor M2, thereby making it possible to convert the input voltage Vin into the first power ELVDD having a desired voltage level.

The first voltage divider 320 divides the voltage (the voltage Vout1 at the first output terminal Out1 or the feedback voltage Vfbp) supplied from the selector 130 to supply the divided voltage to the first switching controller 310.

More specifically, the first voltage divider 320 may receive the voltage Vout1 at the first output terminal OUT1 or the feedback voltage Vfbp through the switching unit 220 included in the selector 130.

The first voltage divider 320 may be configured as a plurality of resistors (for example R1 and R2) connected in series with each other.

The first switching controller 310 receiving the voltage divided by the first voltage divider 320 adjusts duty ratios of the first transistor M1 and the second transistor M2, corresponding to the divided voltage, thereby making it possible to generate a desired first power ELVDD.

The first transistor M1 and the second transistor M2 may be alternately turned on. Therefore the first transistor M1 and the second transistor M2 may be of different conductive types. For example, when the first transistor is a P-type transistor, the second transistor M2 may be an N-type transistor.

Referring to FIG. 4, the second power generator 120 may include a second inductor L2, a third transistor M3, a fourth transistor M4, a second switching controller 330 and a second voltage divider 340.

The second transistor M3 is connected between the power source unit 70 and a second node N2.

The fourth transistor M4 is connected between the second node N2 and a second output terminal OUT2.

The second inductor L2 is connected between the second node N2 and the ground power supply.

The second switching controller 330 controls the third transistor M3 and the fourth transistor M4. In addition, the second switching controller 340 controls turn-on/off operations of the second transistor M3 and the fourth transistor M4, thereby making it possible to convert the input voltage Vin into the second power ELVSS having a desired voltage level.

The second voltage divider 340 divides the voltage Vout2 transferred from the second output terminal OUT2 to supply the divided voltage to the second switching controller 330.

The second voltage divider 340 may be configured as a plurality of resistors (for example R3 and R4) connected in series with each other.

The second switching controller 330 receiving the voltage divided by the second voltage divider 340 adjusts duty ratios of the third transistor M3 and the fourth transistor M4, corresponding to the divided voltage, thereby making it possible to generate a desired second power ELVSS.

The third transistor M3 and the fourth transistor M4 may be alternately turned on. Therefore, the third transistor M3 and the fourth transistor M4 may be of different conductive types. For example, when the third transistor is an N-type transistor, the fourth transistor M4 may be a P-type transistor.

The configurations of the first power generator 110 and the second power generator 120 described above are only an example implementing the present invention. Therefore, the present invention is not limited thereto.

Figure 5:
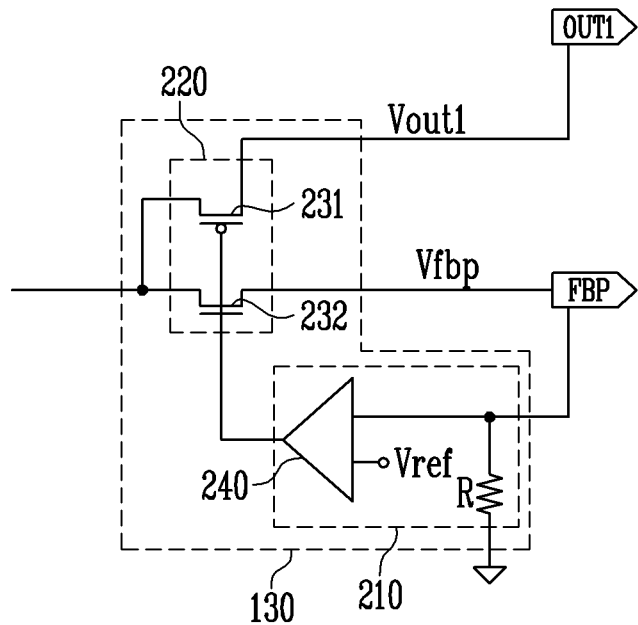
FIG. 5 is a view showing an embodiment of a selector.

FIG. 5 is a view showing an embodiment selector.

Referring to FIG. 5, in an embodiment of the selector, the controller 210 may include a comparator 240.

The comparator 240 receives the feedback voltage Vfbp input to the feedback terminal FBP and a preset reference voltage Vref, and compares magnitudes of both voltages with each other.

The comparator 240 turns off the first switching device 231 and turns on the second switching device 232 in the case in which the feedback voltage Vfbp is larger than the reference voltage Vref, and turns on the first switching device 231 and turns off the second switching device 232 in the case in which the feedback voltage Vfbp is smaller than the reference voltage Vref.

As shown in FIG. 5, in the case in which the first switching device 231 is implemented as a PMOS transistor and the second switching device 232 is implemented as an NMOS transistor by way of example, an output terminal of the comparator 231 may be connected to gate electrodes of the first switching device 231 and the second switching device 232.

Therefore, in the case in which the feedback voltage Vfbp is larger than the reference voltage Vref, when the comparator 240 outputs high-level voltage to the output terminal thereof, the first switching device 231 may be turned off, and the second switching device 232 may be turned on.

Therefore, the feedback voltage Vfbp may be transferred to the first power generator 110 through the second switching device 232. More specifically, the feedback voltage Vfbp may be transferred to the first voltage divider 320 of the first power generator 110 through the second switching device 232.

In addition, in the case in which the feedback voltage is smaller than the reference voltage Vref, when the comparator 240 outputs low-level voltage to the output terminal thereof, the first switching device 231 may be turned on and the second switching device 232 may be turned off.

Therefore, the voltage Vout1 at the first output terminal OUT1 may be transferred to the first power generator 110 through the first switching device 231. More specifically, the voltage Vout1 at the first output terminal OUT1 may be transferred to the first voltage divider 320 of the first power generator 110 through the first switching device 231.

When the comparator 240 is set to output the low-level voltage in the case in which the feedback voltage Vfbp is larger than the reference voltage Vref and to output the high-level voltage in the case in which the feedback voltage Vfbp is smaller than the reference voltage Vref, the first switching device 231 may be implemented as an NMOS transistor and the second switching device 232 may be implemented as a PMOS transistor.

Through the configuration as described above, an embodiment of the selector 130 supplies the voltage Vout1 at the first output terminal OUT1 rather than the feedback voltage Vfbp to the power generator 110 in the case in which the feedback voltage Vfbp becomes lower than a preset reference voltage Vref due to a problem such as disconnection, or the like, of the feedback wiring 140, thereby making it possible to normally operate the OLED without an additionally damage.

In addition, the controller 210 may further include a pull-down resistor R positioned between a common node between the feedback terminal FBP and the comparator 240, and the ground power supply.

Figure 6:
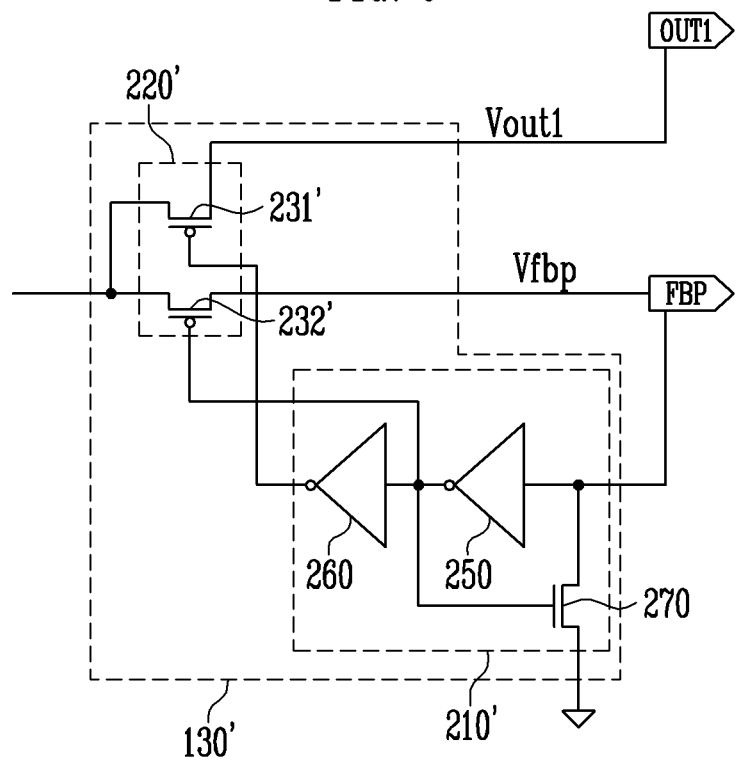
FIG. 6 is a view showing another embodiment of a selector.

FIG. 6 is a view showing another embodiment of a selector.

Referring to FIG. 6, in another embodiment of the selector 130', a controller 210' may include a first inverter 250 and a second inverter 260.

In addition, first and second switching devices 231' and 232' included in the switching unit 220' may be implemented as transistors.

The first inverter 250 has an input terminal connected to a feedback terminal FBP and an output terminal connected to an input terminal of the second inverter 260 and a gate electrode of the second switching device 232' implemented as the transistor.

The second inverter 260 has the input terminal connected to the output terminal of the first inverter 250 and an output terminal connected to a gate electrode of the first switching device 231' implemented as the transistor.

In addition, the controller 210' may further include a pull-down transistor 270 positioned between a common node between the input terminal of the first inverter 250 and the feedback terminal FBP, and the ground power supply. The pull-down transistor may be controlled to be turned on/off by having a gate electrode connected to the output terminal of the inverter 250.

In the case in which normal feedback voltage Vfbp is input to the feedback terminal FBP, the first inverter 250 outputs low level voltage generated by inverting the feedback voltage Vfbp to the output terminal.

Accordingly, the second switching device 232' of which the gate electrode is applied with the low-level voltage is turned on. Therefore, the feedback voltage Vfbp may be transferred to the first power generator 110 through the second switching device 232'. More specifically, the feedback voltage Vfbp may be transferred to the first voltage divider 320 of the first power generator 110 through the second switching device 232.

Since the second inverter 260 has the low-level voltage applied to the input terminal thereof, it outputs high-level voltage generated by inverting the low-level voltage to the output terminal.

Accordingly, the first switching device 231' of which the gate electrode is applied with the high-level voltage is turned off. Therefore, the first output terminal OUT1 and the first power generator 110 may be electrically insulated from each other.

In the case in which the feedback voltage Vfbp is rapidly decreased to the low-level voltage due to disconnection, short-circuit, or the like, of the feedback wiring 140, the first inverter 250 outputs the high-level voltage generated by inverting the low-level feedback voltage Vfbp to the output terminal.

Accordingly, the second switching device 232' of which the gate electrode is applied with the high-level voltage turned off. Therefore, the feedback terminal FBP and the first power generator 110 may be electrically insulated from each other.

Since the second inverter 260 has the high-level voltage applied to the input terminal thereof, it outputs the low-level voltage generated by inverting the high-level voltage to the output terminal.

Accordingly, the second switching device 231' of which the gate electrode is applied with the low-level voltage is turned on. Therefore, the voltage Vout1 at the first output terminal OUT1 may be transferred to the first power generator 110 through the first switching device 231'. More specifically, the voltage Vout1 at the first output terminal OUT1 may be transferred to the first voltage divider 320 of the first power generator 110 through the first switching device 231.

Here, the pull-down transistor 270 may be turned on by the high-level voltage output to the output terminal of the first inverter 250. Therefore, the low-level voltage may be stably supplied to the input terminal of the first inverter 250.

As set forth above, according to certain embodiments of the present invention, a DC-DC converter is capable of being normally operated without an additional damage even though the feedback wiring present at an outer portion thereof is disconnected, and an organic light emitting display including the DC-DC converter is provided.

While the present invention has been described in connection with certain embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A direct current (DC)-DC converter, comprising:
a power generator configured to generate a first voltage;
an output terminal connected to the power generator and configured to output the first voltage;
a feedback terminal connected to an external feedback wiring and configured to input a second voltage to a selector; and
the selector connected to the power generator, the output terminal and the feedback terminal, and configured to transfer the first voltage or the second voltage to the power generator, wherein the selector includes:
a switching unit including a first transistor and a second transistor, wherein the first transistor is connected between the power generator and the output terminal and is configured to transfer the first voltage to the power generator when the first transistor is turned on, and the second transistor is connected between the power generator and the feedback terminal and is configured to transfer the second voltage to the power generator when the second transistor is turned on; and
a controller connected to the feedback terminal to receive the second voltage and controlling to turn on any one of the first transistor and the second transistor in accordance with the second voltage, wherein the controller is connected to a gate of the first transistor and a gate of the second transistor, and is configured not to receive the first voltage.

2. The DC-DC converter of claim 1, wherein the controller includes a comparator configured to compare the second voltage with a reference voltage to determine which of the first and second transistors to turn on.

3. The DC-DC converter of claim 2, wherein the comparator turns the second transistor on if the second voltage is larger than the reference voltage, and turns the first transistor on if the second voltage is smaller than the reference voltage.

4. The DC-DC converter of claim 1, wherein the controller includes:
a first inverter having an input terminal connected to the feedback terminal and an output terminal connected to an input terminal of a second inverter and a gate electrode of the second transistor; and
the second inverter having an input terminal connected to the output terminal of the first inverter and an output terminal connected to a gate electrode of the first transistor.

5. The DC-DC converter of claim 1, wherein the power generator includes:
an inductor connected between a power supply unit and a first node;
a third transistor connected between the first node and a ground;
a fourth transistor connected between the first node and the output terminal;
a switching controller configured to control the third transistor and the fourth transistor; and
a voltage divider configured to divide voltage supplied from the selector to supply the divided voltage to the switching controller.

6. The DC-DC converter of claim 5, wherein the voltage divider includes a plurality of resistors connected in series with each other.

7. The DC-DC converter of claim 1, wherein the power generator includes:
a third transistor connected between a power supply unit and a first node;
a fourth transistor connected between the first node and the output terminal;
an inductor connected between the first node and a ground;
a switching controller configured to control the third transistor and the fourth transistor; and
a voltage divider configured to divide voltage supplied from the selector to supply the divided voltage to the switching controller.

8. The DC-DC converter of claim 7, wherein the voltage divider includes a plurality of resistors connected in series with each other.

9. The DC-DC converter of claim 1, wherein the first voltage is a positive voltage or a negative voltage.

10. An organic light emitting display comprising:
a plurality of pixels connected to scan lines, data lines, and a power line; and
a DC-DC converter generating a first voltage to supply to the pixels through the power line,
a power supply unit configured to generate an input voltage;
wherein the DC-DC converter includes:
a power generator configured to receive the input voltage from the power supply unit and generate the first voltage;
an output terminal connected to the power generator and configured to output the first voltage;

a feedback terminal connected to an external feedback wiring and configured to transfer a second voltage to a selector; and the selector connected to the power generator, the output terminal and the feedback terminal, wherein the selector is configured to receive the first voltage and the second voltage, and transfer the first voltage or the second voltage to the power generator, wherein the selector includes:

a switching unit including a first transistor and a second transistor, wherein the first transistor is connected between the power generator and the output terminal and is configured to transfer the first voltage to the power generator when the first transistor is turned on, and the second transistor is connected between the power generator and the feedback terminal and is configured to transfer the second voltage to the power generator when the second transistor is turned on; and a controller connected to the feedback terminal to receive the second voltage and controlling to turn on any one of the first transistor and the second transistor in accordance with the second voltage, wherein the controller is connected to a gate of the first transistor and a gate of the second transistor, and is configured not to receive the first voltage.

11. The organic light emitting display of claim 10, wherein the controller includes a comparator configured to compare the second voltage with a reference voltage to determine which of the first and second transistors to turn on.

12. The organic light emitting display of claim 11, wherein the comparator turns on the second transistor if the second voltage is larger than the reference voltage and turns on the first transistor if the second voltage is smaller than the reference voltage.

13. The organic light emitting display of claim 10, wherein the controller includes:

a first inverter having an input terminal connected to the feedback terminal and an output terminal connected to an input terminal of a second inverter and a gate electrode of the second transistor; and the second inverter having an input terminal connected to the output terminal of the first inverter and an output terminal connected to a gate electrode of the first transistor.

14. The organic light emitting display of claim 10, wherein the power generator includes:

an inductor connected between the power supply unit and a first node;

a third transistor connected between the first node and a ground;

a fourth transistor connected between the first node and the output terminal;

a switching controller configured to control the third transistor and the fourth transistor; and a voltage divider configured to divide voltage supplied from the selector to supply the divided voltage to the switching controller.

15. The organic emitting display of claim 14, wherein the voltage divider includes a plurality of resistors connected in series with each other.

16. The organic light emitting display of claim 10, wherein the power generator includes:

a third transistor connected between the power supply unit and a first node;

a fourth transistor connected between the first node and the output terminal;

an inductor connected between the first node and a ground;

a switching controller configured to control the third transistor and the fourth transistor; and a voltage divider configured to divide voltage supplied from the selector to supply the divided voltage to the switching controller.

17. The organic light emitting display of claim 16, wherein the voltage divider includes a plurality of resistors connected in series with each other.

18. The organic light emitting display of claim 10, wherein the first voltage is a positive voltage or a negative voltage.

19. The organic light emitting display of claim 10, further including:

a scan driver configured to supply scan signals to the pixels through the scan lines; and a data driver configured to supply data signals to the pixels through the data lines.

* * * * *